(12) United States Patent
Su et al.

(10) Patent No.: US 8,755,194 B2
(45) Date of Patent: Jun. 17, 2014

(54) WATERPROOF ELEMENT AND ELECTRONIC DEVICE HAVING THE WATERPROOF ELEMENT

(75) Inventors: Chia-Cheng Su, New Taipei (TW); Tsung-Hsien Chen, New Taipei (TW); Po-Yuan Hsu, New Taipei (TW); Hsing-Wang Chang, New Taipei (TW)

(73) Assignee: Wistron Corporation, New Taipei (TW)

(*) Notice: Subject to any disclaimer, the term of this patent is extended or adjusted under 35 U.S.C. 154(b) by 13 days.

(21) Appl. No.: 13/158,017

(22) Filed: Jun. 10, 2011

(65) Prior Publication Data

US 2012/0120620 A1 May 17, 2012

(30) Foreign Application Priority Data

Nov. 11, 2010 (TW) .................................. 099138815

(51) Int. Cl.
*H05K 5/00* (2006.01)
*H05K 5/06* (2006.01)
(52) U.S. Cl.
CPC ........................................ *H05K 5/069* (2013.01)
USPC .............. 361/752; 361/807; 174/67; 439/271
(58) Field of Classification Search
USPC .................. 361/752, 807, 679.01–679.45; 361/679.55–679.59; 439/271, 279, 556; 220/794–795, 302.1–302.3; 174/66, 67
See application file for complete search history.

(56) References Cited

U.S. PATENT DOCUMENTS

| | | | | |
|---|---|---|---|---|
| 5,045,971 A | * | 9/1991 | Ono et al. ...................... | 361/704 |
| 5,782,658 A | * | 7/1998 | Maegawa et al. ............. | 439/595 |
| 5,845,803 A | * | 12/1998 | Saito et al. .................... | 220/378 |
| 6,133,531 A | * | 10/2000 | Hayduke et al. ................ | 174/67 |
| 6,146,198 A | * | 11/2000 | Maeda ........................... | 439/587 |
| 6,311,865 B1 | * | 11/2001 | Laurent ......................... | 220/739 |
| 6,350,949 B1 | * | 2/2002 | Boyd ............................ | 174/50.5 |
| 6,559,380 B2 | * | 5/2003 | Soboleski ........................ | 174/66 |

(Continued)

FOREIGN PATENT DOCUMENTS

| | | |
|---|---|---|
| CN | 201430736 Y | 3/2010 |
| TW | 487231 | 5/2002 |

OTHER PUBLICATIONS

Office Action and English translation thereof for corresponding Taiwanese Application No. 099138815 dated Jun. 21, 2013.

(Continued)

*Primary Examiner* — Adrian S Wilson
*Assistant Examiner* — Abhishek Rathod
(74) *Attorney, Agent, or Firm* — Renner, Otto, Boisselle & Sklar, LLP

(57) ABSTRACT

An electronic device includes a housing unit having an accommodating portion, and first and second openings communicating with the accommodating portion. A waterproof element is made of a resilient material, and includes a main body that is disposed on the accommodating portion and that has a top face, and a side face extending upwardly from the top face. The electronic component module includes a circuit board and an electronic component. The circuit board has a board bottom face disposed on and abutting against the top face of the main body and covering the second opening, and a board edge abutting against the side face of the main body. An electronic component is attached to the circuit board, extends through the main body of the waterproof element, is disposed inside the accommodating portion, and faces the first opening.

13 Claims, 7 Drawing Sheets

(56) References Cited

U.S. PATENT DOCUMENTS

| | | | |
|---|---|---|---|
| 6,977,354 B1* | 12/2005 | Shea et al. | 218/157 |
| 7,061,775 B2* | 6/2006 | Beihoff et al. | 361/818 |
| 7,372,705 B1* | 5/2008 | Spivey et al. | 361/796 |
| 7,464,814 B2* | 12/2008 | Carnevali | 206/320 |
| 7,648,043 B2* | 1/2010 | Chen | 220/825 |
| 7,679,923 B2* | 3/2010 | Inagaki et al. | 361/752 |
| 7,936,566 B2* | 5/2011 | Shigyo et al. | 361/752 |
| 2001/0018490 A1* | 8/2001 | Mashita et al. | 525/94 |
| 2001/0021103 A1* | 9/2001 | Takagi | 361/752 |
| 2008/0188107 A1* | 8/2008 | Garcia et al. | 439/271 |
| 2009/0109635 A1* | 4/2009 | Chen et al. | 361/728 |
| 2010/0206704 A1* | 8/2010 | Shimura et al. | 200/302.2 |
| 2010/0267264 A1* | 10/2010 | Sawairi et al. | 439/271 |
| 2011/0235290 A1* | 9/2011 | Luhr et al. | 361/752 |

OTHER PUBLICATIONS

Office Action and English translation thereof for corresponding Chinese Application No. 201010050889.2 dated Nov. 20, 2013.

* cited by examiner

WATERPROOF ELEMENT AND ELECTRONIC DEVICE HAVING THE WATERPROOF ELEMENT

CROSS-REFERENCE TO RELATED APPLICATION

This application claims priority of Taiwanese Application No. 099138815, filed on Nov. 11, 2010, which is hereby incorporated by reference.

BACKGROUND OF THE INVENTION

1. Field of the Invention

This invention relates to an electronic device, and more particularly to an electronic device having a waterproof element and the waterproof element thereof.

2. Description of the Related Art

Input/output (I/O) connecting ports of a conventional electronic device are formed as openings in a casing thereof to expose I/O connecting devices provided in the casing. To prevent dust or liquid body from entering the casing of the conventional electronic device and affect the other electronic components inside the casing through the I/O connecting ports, the casing is provided with a waterproof dustproof cover for covering the connecting ports, or the I/O connecting device and a portion of the casing are made by an insert molding process. Although the waterproof dustproof cover can achieve its intended purpose, the casing of the conventional electronic device must have a sufficient space for accommodating the cover. In view of a small electronic device, it poses difficulty. In the case of insert molding the I/O connecting device, the cost is high.

SUMMARY OF THE INVENTION

Therefore, an object of the present invention is to provide a waterproof element that has a simple structure, that has a low cost, and that does not occupy a substantial space and an electronic device having the waterproof element.

According to one aspect of this invention, an electronic device comprises a housing unit, a waterproof element, and an electronic component module. The housing unit includes an accommodating portion, and first and second openings communicating with the accommodating portion. The waterproof element is made of a resilient material, and includes a main body that is disposed on the accommodating portion and that has a top face, and a side face extending upwardly from the top face. The electronic component module includes a circuit board and an electronic component. The circuit board has a board bottom face disposed on and abutting against the top face of the main body and covering the second opening, and a board edge abutting against the side face of the main body. The electronic component is attached to the circuit board, extends through the main body of the waterproof element, is disposed inside the accommodating portion, and faces the first opening.

According to another aspect of this invention, a waterproof element is adapted to be disposed between a housing unit and a circuit board. The circuit board has a board bottom face and a board edge. The waterproof element comprises a main body made of an elastic material and adapted to be disposed between the housing unit and the circuit board. The main body has a top face for abutment with the board bottom face of the circuit board, and a side face extending upwardly from the top face of the main body for abutment with the board edge of the circuit board.

The efficiency of the present invention resides in the fact that through the structural design of the waterproof element, the circuit board is provided with upward, downward, and sideward abutments so that a good waterproof effect may be provided. Further, the whole structure of the waterproof element is simple, so that it has a low manufacturing cost, and it does not occupy a substantial space in the electronic device.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
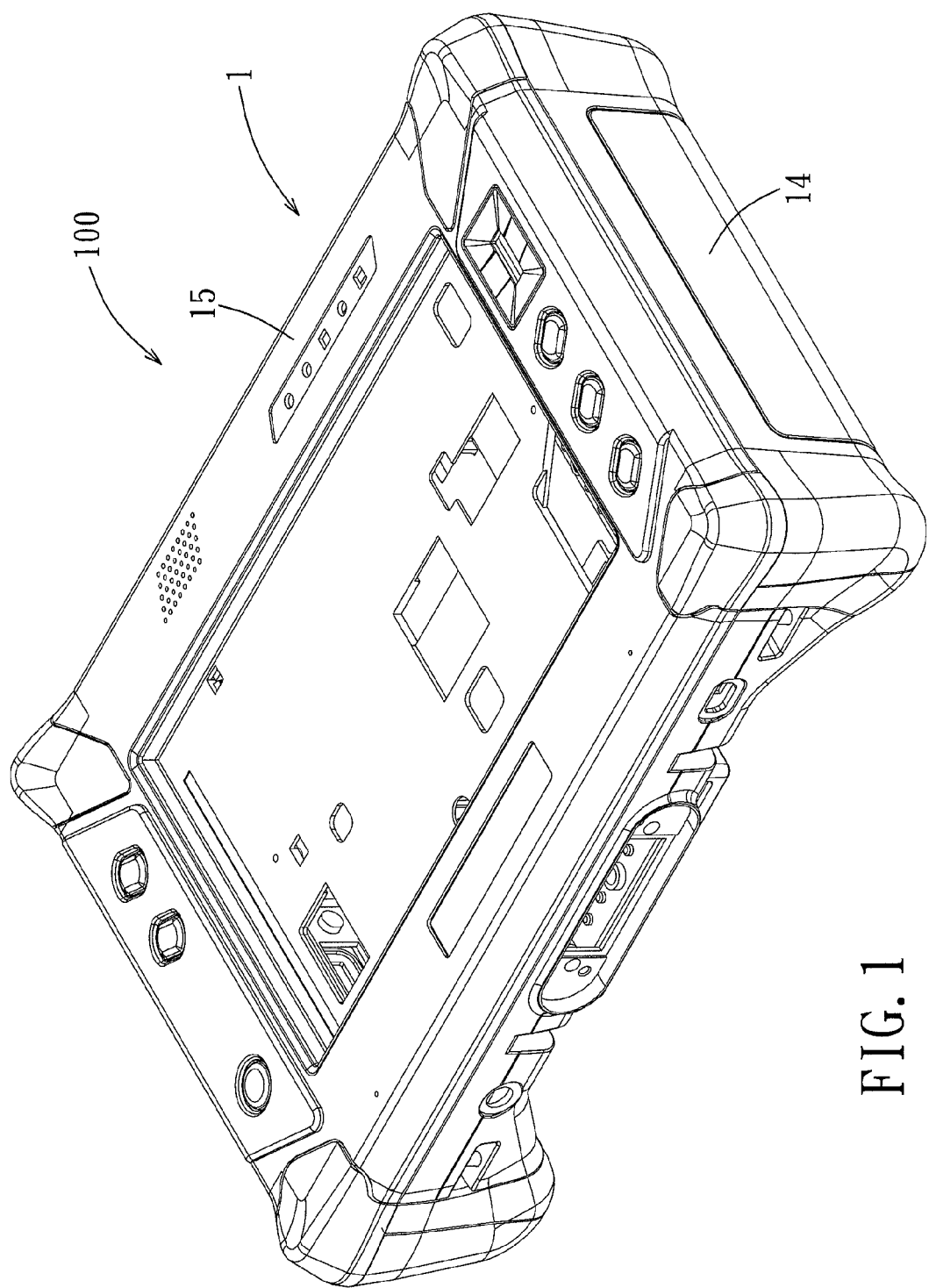
FIG. 1 is a perspective view of an electronic device according to the preferred embodiment of the present invention.

The above-mentioned and other technical contents, features, and effects of this invention will be clearly presented from the following detailed description of one preferred embodiment in coordination with the reference drawings.

Referring to FIGS. 1 to 5, an electronic device 100 according to the preferred embodiment of the present invention comprises a housing unit 1, an electronic component module 2, a waterproof element 3, and a fastening unit.

The housing unit 1 is formed with an accommodating portion 11, and first and second openings 12, 13 both communicating with the accommodating portion 11. In this embodiment, the housing unit 1 includes a lower casing member 14, and an upper casing member 15 connected to the lower casing member 14. The lower casing member 14 includes a bottom wall 141, and an outer upstanding wall 142 extending upwardly from a peripheral end of the bottom wall 141 and having an inner surface 146. The bottom wall 141 and the outer upstanding wall 142 cooperatively define a receiving space 143. The accommodating portion 11 is formed in the lower casing member 14, and includes an inner upstanding wall 111 extending upwardly from the bottom wall 141 within the receiving space 143. The inner upstanding wall 111 extends in a U-shaped configuration, and has two opposite ends connected to a portion of the inner surface 146 of the outer upstanding wall 142. The inner upstanding wall 111 and the portion of the inner surface 146 of the outer upstanding wall 142 cooperatively define an accommodating space 112 located within the receiving space 143. The first opening 12 is formed in the outer upstanding wall 142 at a position corresponding to and communicating with the accommodating space 112. The inner upstanding wall 111 further has a top edge 113 defining the second opening 13.

Figure 5:
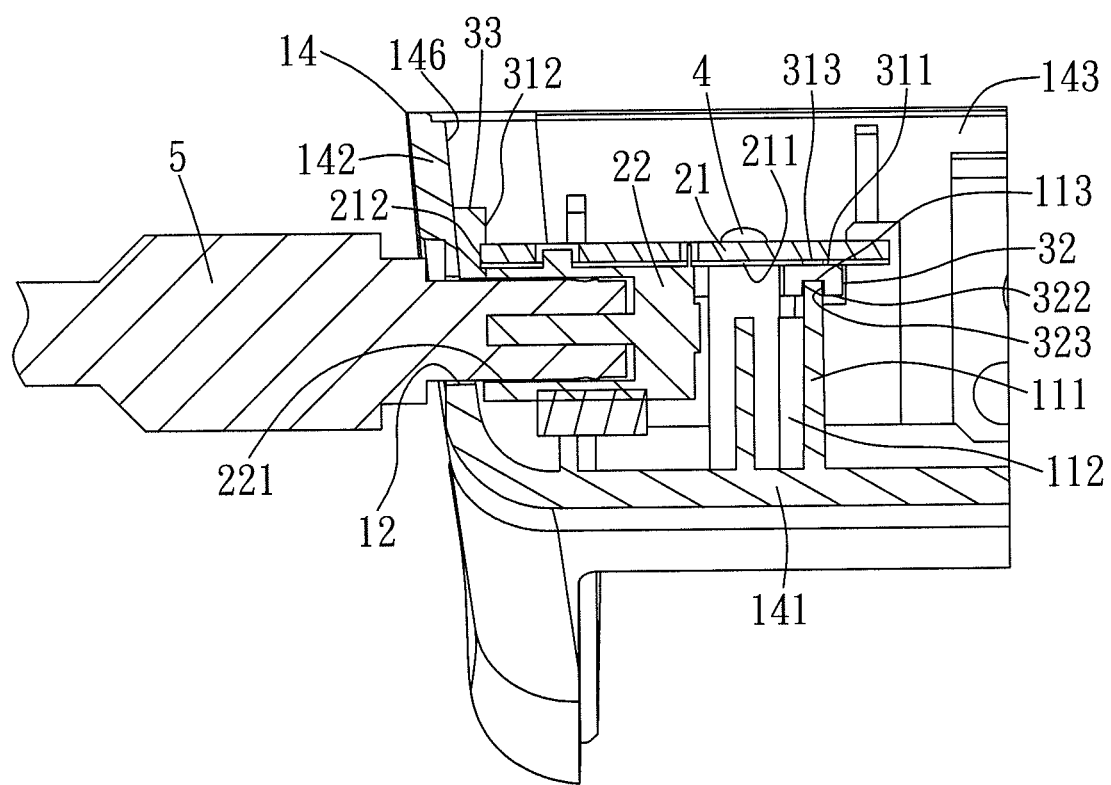
FIG. 5 is a sectional view of the preferred embodiment taken along line A-A of FIG. 4.

The electronic component module 2 includes a circuit board 21, and an electronic component 22 attached to the circuit board 21. The circuit board 21 is disposed above the top edge 113 of the inner upstanding wall 111 so that the electronic component 22 is located inside the accommodating space 112. The circuit board 21, as shown in FIG. 5, has a board bottom face 211 and a board edge 212. The electronic component 22 is formed with a plug hole 221 that faces the first opening 12. The electronic component 22, in this embodiment, may be an I/O connecting device, such as a USB, PCMIA, or VGA connecting device, and may be fixed to the circuit board 21 by using solder paste or an SMT (surface mount technology) method. Alternatively, the electronic component 22 may be in other forms.

The waterproof element 3 is disposed between the top edge 113 and the circuit board 21 to prevent a liquid body entering the accommodating space 112 via the first opening 12 to flow into the receiving space 145 via the second opening 13. The waterproof element 3 is made of a resilient material, such as silicone or rubber, and includes a main body 31 having a top face 311, and a side face 312 extending upwardly from the top face 311. The main body 31 includes first and second wall portions 32, 33 connected to each other and forming an L-shaped configuration. The first wall portion 32 extends in a U-shaped configuration, and has the top face 311, two opposite ends 321 connected to the second wall portion 33, and a bottom face 322 opposite to the top face 311. The first wall portion 32 is disposed on the top edge 113 of the inner upstanding wall 111. The electronic component 22 extends through the first wall portion 32, and is accommodated inside the accommodating space 112. The second wall portion 33 has the side face 312.

The fastening unit includes a plurality of fastening elements 4 that are configured as screws in this embodiment.

Figure 2:
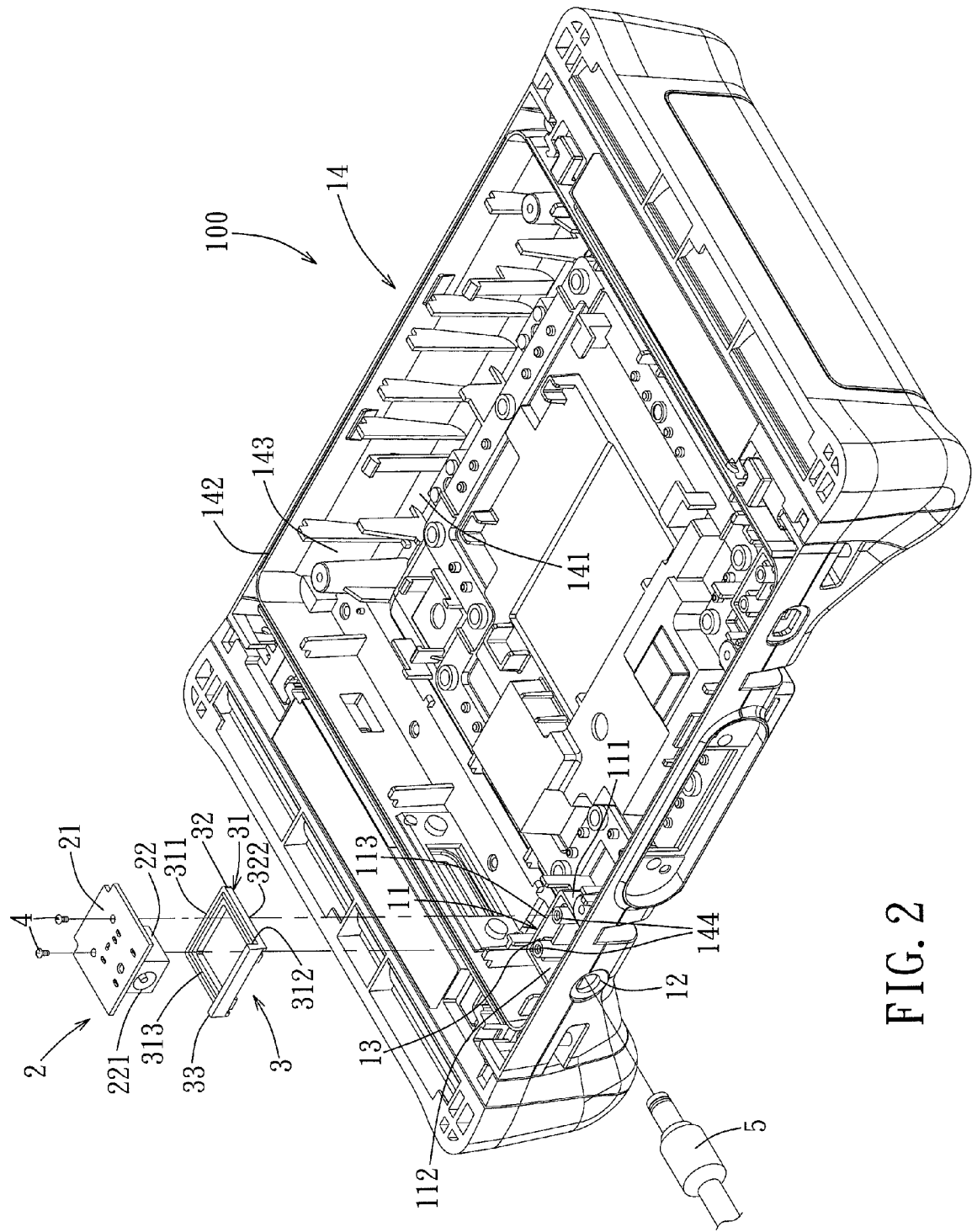
FIG. 2 is an exploded perspective view of the preferred embodiment, but with an upper casing member removed.
Figure 3:
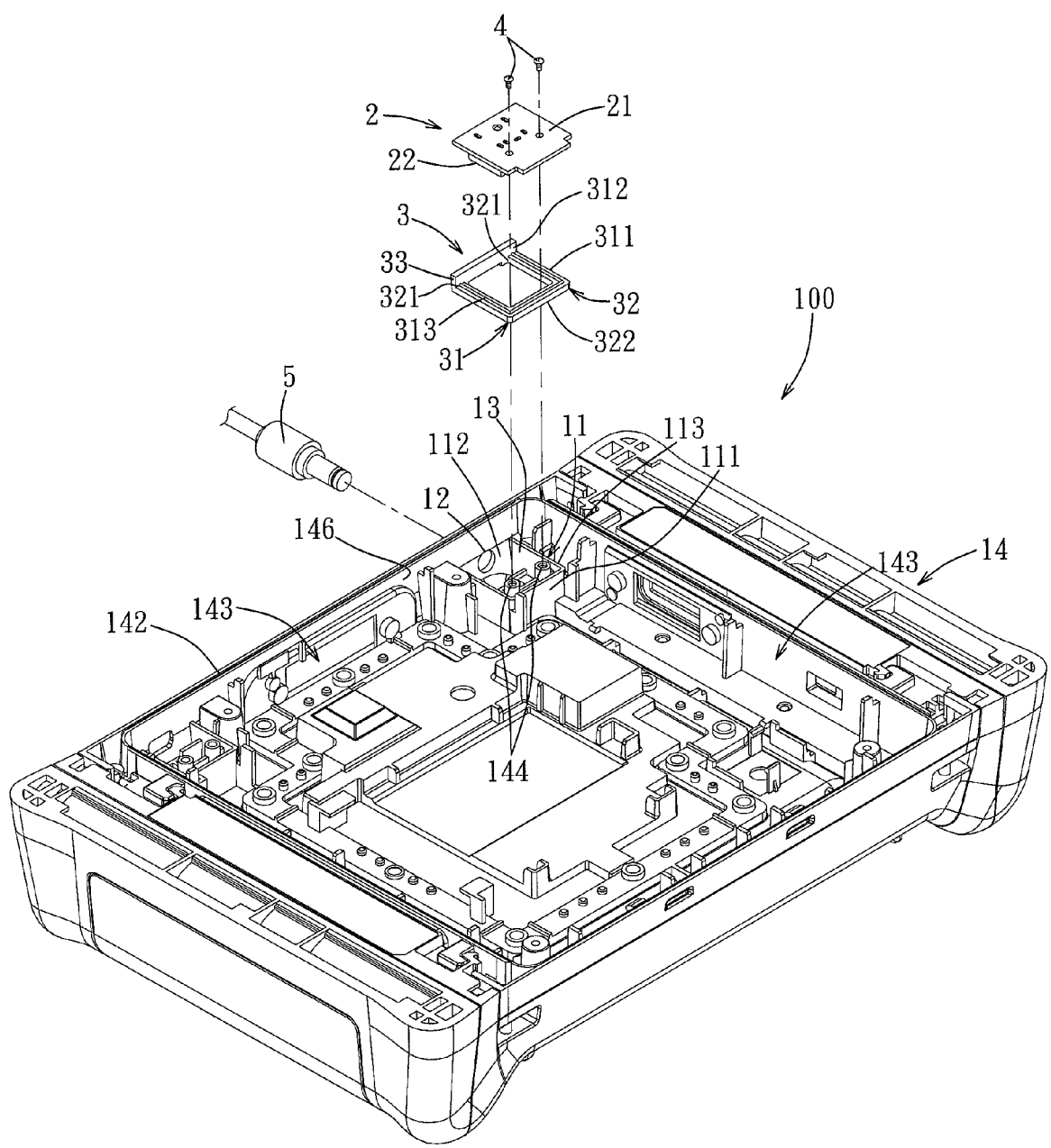
FIG. 3 is an exploded perspective view of the preferred embodiment taken from another angle.
Figure 4:
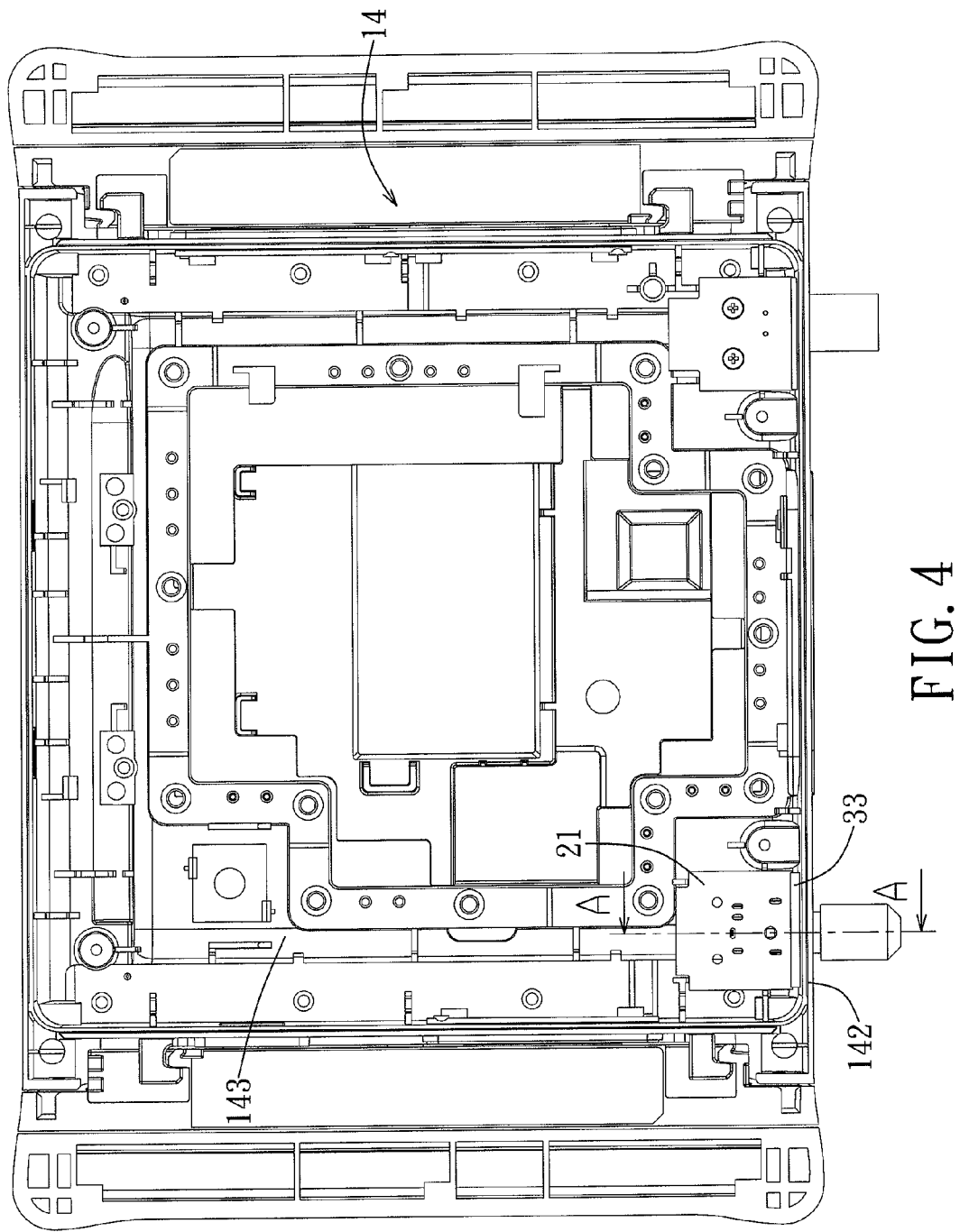
FIG. 4 is a schematic top view of the preferred embodiment in an assembled state.

With reference to FIGS. 2, 4, and 5, when the waterproof element 3 is disposed between the top edge 113 of the inner upstanding wall 111 and the circuit board 21, the bottom face 322 of the first wall portion 32 abuts against the top edge 113, and another face of the second wall portion 33 that is opposite to the side face 312 abuts against the portion of the inner surface 146 of the outer upstanding wall 142. Further, the board bottom face 211 of the circuit board 21 abuts against the top face 311 of the first wall portion 31, and covers the second opening 13. The board edge 212 of the circuit board 21 abuts against the side face 312. A plug connecting device 5 is inserted into the plug hole 221 in the electronic component 22 via the first opening 12. The fastening elements 4 extend through the circuit board 21 and the first wall portion 32 of the main body 31 of the waterproof element 3 to respectively engage screw holes 144 (which may be preformed in the bottom wall 141 of the lower casing member 14) in the bottom wall 141 to thereby fix the electronic component module 2 to the housing unit 1. Through the fastening force of the fastening elements 4, the waterproof element 3 is pressed tightly between the circuit board 21 and the top edge 113, thereby preventing a liquid body entering the accommodating space 112 via the first opening 12 to flow through a gap between the circuit board 21 and the top edge 113 into the receiving space 143 and affect the other electronic components provided inside the housing unit 1.

Preferably, by adjusting the position of the screw holes 144 in the bottom wall 141, the board edge 212 of the circuit board 21 can be pressed tightly against the side face 312 of the second wall portion 33 when the fastening elements 4 are engaged to the bottom wall 141.

From the aforesaid description, it is apparent that when the circuit board 21 is disposed above the waterproof element 3, the waterproof element 3 is providing the circuit board 21 with upward, downward, and sideward abutments, so that waterproof effects on these directions of the circuit board 21 are also provided.

In order to have a tighter relationship between the circuit board 21 and the main body 31 of the waterproof element 3, preferably, the first wall portion 32 of the waterproof element 3 has a protrusion 313 projecting from and extending along the top face 311 thereof for abutment of the board bottom face 211 of the circuit board 21 against the protrusion 313. Through the fastening force of the fastening elements 4, the circuit board 21 forms a compression force on the protrusion 313 to ensure that the circuit board 21 can completely abut against the top face 311 of the waterproof element 3, thereby preventing easy formation of a gap between contact surfaces of the two. Preferably, two opposite ends of the protrusion 313 extend to a junction between the first and second wall portions 32, 33.

To have a better waterproof effect between the waterproof element 3 and the top edge 113 of the inner upstanding wall 111, the first wall portion 32 has an engaging groove 323 formed in and extending along the bottom face 322 thereof to engage the top edge 113 of the inner upstanding wall 111. Apart from providing more stable connection between the main body 31 and the inner upstanding wall 111, through a protrusion/indentation structure of the engaging groove 323 and the top edge 113, difficult passage of the liquid body between the bottom face 322 of the first wall portion 32 and the top edge 113 of the inner upstanding wall 111 can be increased, thereby further enhancing the waterproof effect of the present invention.

Additionally, in this embodiment, the fastening elements 4 are configured as screws. Alternatively, elements that can interconnect two objects can be used as the fastening elements 4, for example, hooks, rivets, etc.

Figure 6:
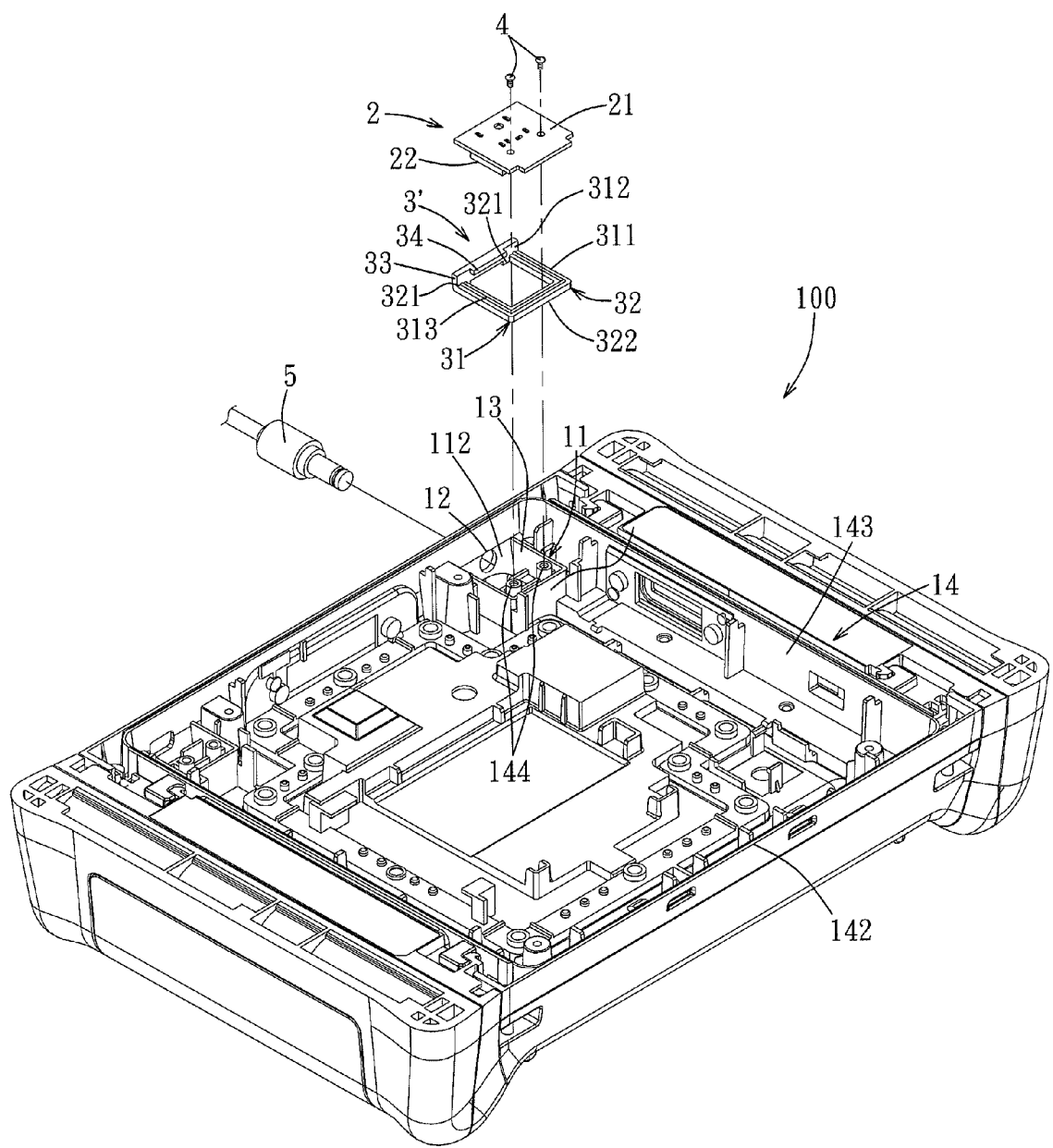
FIG. 6 is a view similar to FIG. 3, but illustrating an alternative form of the waterproof element of the present invention.
Figure 7:
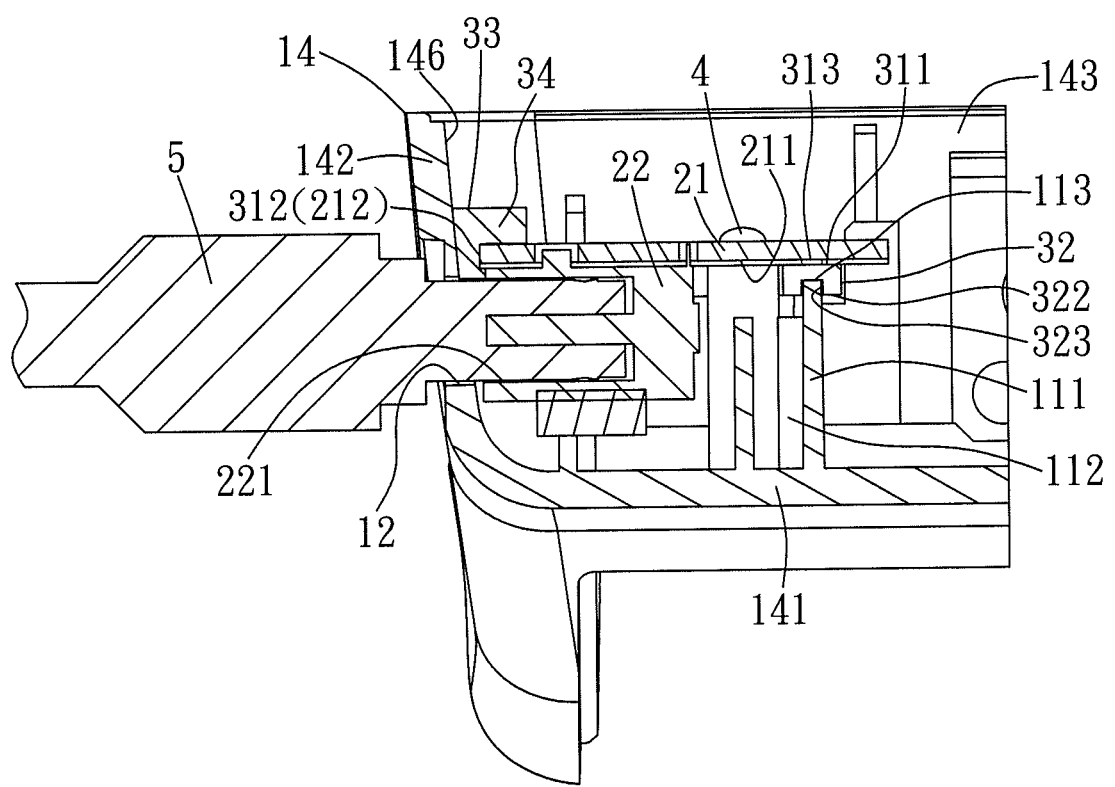
FIG. 7 is an assembled sectional view of FIG. 6.

FIGS. 6 and 7 illustrate an alternative form of the waterproof element 3' which is substantially similar to the waterproof element 3. The waterproof element 3' further includes a flange 34 projecting from the side face 312 of the second wall portion 33 above the top face 311 of the first wall portion 32. The circuit board 21 is inserted between the flange 34 and the top face 311. When the board edge 212 of the circuit board 21 abuts against the side face 312, the circuit board 21 is simultaneously suppressed by the flange 34, thereby increasing stability of abutment of the circuit board 21 against the main body 31 of the waterproof element 3'.

From the aforesaid description, through the structural design of the waterproof element 3, 3', a tighter relationship can be achieved among the waterproof element 3, 3', the circuit board 21, and the top edge 113 of the inner upstanding wall 11. Further, since the waterproof element 3, 3' provides the circuit board 21 with the upward, downward, and sideward abutments, a good waterproof effect can be provided. Moreover, since the whole structure of the waterproof element 3, 3' is simple, the manufacturing cost thereof is minimized. Additionally, the waterproof element 3, 3' does not occupy a substantial space in the electronic device 100. Hence, the object of the present invention can be realized.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:

1. An electronic device, comprising:
   a housing unit including an accommodating portion, and first and second openings communicating with said accommodating portion;
   a waterproof element made of a resilient material and including a main body that is disposed on said accommodating portion and that has a top face, and a side face extending upwardly from said top face; and
   an electronic component module including
      a circuit board having a board bottom face disposed on and abutting against said top face of said main body and covering said second opening, and a board edge abutting against said side face of said main body; and
      an electronic component attached to said circuit board, extending through said main body of said waterproof element, disposed inside said accommodating portion, and facing said first opening;
   wherein said main body includes first and second wall portions connected to each other and forming an L-shape configuration, said first wall portion having said top face, said second wall portion having said side face;
   wherein said housing unit further includes interconnected upper and lower casing members, said lower casing member having said first opening and said accommodating portion, said accommodating portion including an inner upstanding wall that has a top edge, said first wall portion of said waterproof element being disposed on said top edge of said inner upstanding wall; and
   wherein said lower casing member has an outer upstanding wall confining a receiving space, said first opening being formed in said outer upstanding wall, said inner upstanding wall being connected to a portion of an inner surface of said outer upstanding wall, said portion of said inner surface of said outer upstanding wall and said inner upstanding wall cooperatively defining an accommodating space located within said receiving space and accommodating therein said electronic component, said too edge defining said second opening, said second wall portion of said waterproof element abutting against said portion of said inner surface of said outer upstanding wall.

2. The electronic device of claim 1, further comprising a fastening unit for fixing said circuit board to said housing unit.

3. The electronic device of claim 1, wherein said electronic component is configured as an input/output connecting device.

4. An electronic device, comprising:
   a housing unit including an accommodating portion, and first and second openings communicating with said accommodating portion;
   a waterproof element made of a resilient material and including a main body that is disposed on said accommodating portion and that has a top face, and a side face extending upwardly from said top face; and
   an electronic component module including
      a circuit board having a board bottom face disposed on and abutting against said top face of said main body and covering said second opening, and a board edge abutting against said side face of said main body; and
      an electronic component attached to said circuit board, extending through said main body of said waterproof element, disposed inside said accommodating portion, and facing said first opening;
   wherein said main body of said waterproof element includes first and second wall portions connected to each other and forming an L-shape configuration;
   wherein said accommodating portion includes an inner upstanding wall that has a top edge; and
   wherein said first wall portion is disposed on said top edge of said inner upstanding wall and further has a bottom face formed with an engaging groove to engage said top edge of said inner upstanding wall.

5. The electronic device of claim 4, wherein said first wall portion has said top face, and said second wall portion has said side face.

6. The electronic device of claim 4, wherein said housing unit further includes interconnected upper and lower casing members, said lower casing member having said first opening and said accommodating portion.

7. The electronic device of claim 4, further comprising a fastening unit for fixing said circuit board to said housing unit.

8. The electronic device of claim 4, wherein said electronic component is configured as an input/output connecting device.

9. An electronic device, comprising:
   a housing unit including an accommodating portion, and first and second openings communicating with said accommodating portion;
   a waterproof element made of a resilient material and including a main body that is disposed on said accommodating portion and that has a top face, and a side face extending upwardly from said top face; and
   an electronic component module including
      a circuit board having a board bottom face disposed on and abutting against said top face of said main body and covering said second opening, and a board edge abutting against said side face of said main body; and
      an electronic component attached to said circuit board, extending through said main body of said waterproof element, disposed inside said accommodating portion, and facing said first opening;
   wherein said main body includes first and second wall portions connected to each other and forming an L-shape configuration, said first wall portion having said top face, said second wall portion having said side face; and
   wherein said first wall portion has a substantially U-shaped cross section, two opposite ends connected to said second wall portion, and a protrusion projecting from and extending along said top face of said first wall portion, said board bottom face of said circuit board abutting against said protrusion.

10. An electronic device, comprising:
    a housing unit including an accommodating portion, and first and second openings communicating with said accommodating portion;
    a waterproof element made of a resilient material and including a main body that is disposed on said accommodating portion and that has a top face, and a side face extending upwardly from said top face; and
    an electronic component module including
       a circuit board having a board bottom face disposed on and abutting against said top face of said main body and covering said second opening, and a board edge abutting against said side face of said main body; and
       an electronic component attached to said circuit board, extending through said main body of said waterproof element, disposed inside said accommodating portion, and facing said first opening;

wherein said waterproof element further includes a flange projecting from said side face of said main body above said top face, said circuit board being inserted between said flange and said top face.

11. A waterproof element adapted to be disposed between a housing unit and a circuit board, the circuit board having a board bottom face and a board edge, said waterproof element comprising:

a main body made of an elastic material and adapted to be disposed between the housing unit and the circuit board, said main body having a top face for abutment with the board bottom face of the circuit board, and a side face extending upwardly from said top face of said main body for abutment with the board edge of the circuit board;

wherein said main body includes first and second wall portions connected to each other and forming an L-shape configuration, said first wall portion having said top face, said second wall portion having said side face; and said first wall portion having laterally spaced apart inner and outer side surfaces and a bottom face extending between the inner and outer side surfaces, the bottom face being formed with a downwardly opening groove inwardly spaced apart from the inner and outer side surfaces for receiving a top edge of the housing unit.

12. The waterproof element of claim 11, wherein said first wall portion further has a protrusion projecting from and extending along said top face for abutment with the board bottom face of the circuit board.

13. The waterproof element of claim 11, further comprising a flange projecting from said side face of said main body above said top face, said flange and said top face being adapted to abut against the circuit board.

* * * * *